United States Patent [19]

Anderson

[11] 4,109,052

[45] Aug. 22, 1978

[54] ELECTROCONDUCTIVE TRANSPARENCY

[75] Inventor: Jerrel Charles Anderson, Vienna, W. Va.

[73] Assignee: E. I. Du Pont de Nemours and Company, Wilmington, Del.

[21] Appl. No.: 796,185

[22] Filed: May 12, 1977

[51] Int. Cl.² .................... B32B 15/08; B32B 27/36; B44F 1/06; G03G 7/00
[52] U.S. Cl. ............................... 428/409; 156/280; 156/332; 427/124; 427/161; 427/250; 428/420; 428/458; 428/463; 428/520; 428/522; 428/918
[58] Field of Search ............... 428/420, 458, 409, 918, 428/500, 515, 520, 522, 463; 427/250, 124, 125, 161; 156/280, 332

[56] References Cited

U.S. PATENT DOCUMENTS

| | | | |
|---|---|---|---|
| 3,317,493 | 5/1967 | Selby | 428/463 X |
| 3,776,805 | 12/1973 | Hansen | 428/458 X |
| 3,891,486 | 6/1975 | Willdorf | 427/250 X |
| 3,949,134 | 4/1976 | Willdorf | 428/458 X |
| 4,075,386 | 2/1978 | Wildorf | 428/458 X |

FOREIGN PATENT DOCUMENTS 1,264,338 2/1972 United Kingdom.
1,417,628 12/1975 United Kingdom.

*Primary Examiner*—Harold Ansher

[57] ABSTRACT

A film laminate having low surface resistivity, high abrasion resistance, and high light transmission includes a polymeric substrate layer and a transparent metal layer bonded to the substrate by a polymeric coupler. A polymeric coating is applied over the metal layer.

12 Claims, No Drawings

ELECTROCONDUCTIVE TRANSPARENCY

BACKGROUND OF THE INVENTION

Electroconductive transparencies, such as those used in electrophotographic processes, require high light transmission and rather low surface resistivity. They also must be mechanically strong and resistant to abrasion and layer separation.

Transparent, electrically conductive film structures are known. British Pat. No. 1,417,628 discloses an electrophotographic film having an organic, polymeric transparent substrate and a layer of noble metal sputtered thereon. The noble metal is, in turn, coated with a layer of a photoconductive, polymeric material. According to this reference, adhesion between the metal layer and the substrate is strong. Apparently, no special treatment of the substrate's surface is necessary prior to the application of the metal, although this disclosure suggests that adhesion may be improved by coating the substrate with a thermosetting polymer. Metal sputtering, however, is not a desirable technique because it usually can be done only at slow rates to improve adhesion to the base film. Simple, continuous metal vaporization techniques also have been employed in the past, but the adhesion of the vaporized metal to the base film was deficient. Furthermore, the abrasion resistance of both vaporized and sputtered films was poor whether the base, organic polymer film was untreated or electrically or thermally precleaned. Various disclosures teach primer coatings to improve adhesion between a substrate film and a layer of material applied thereto. For example, British Pat. No. 1,264,338 discloses a number of suitable materials other than "heat-sealable coating polymers". This reference suggests that the primer-coated base film is more receptive to subsequent coating, printing, or "metallising". However, no further teaching as to such metallizing process or products is provided. It appears that this disclosure contemplates reflective coatings of substantial thickness, such as those used in printing and the like. Prior art electrophotoconductive, transparent, film laminates in which the metal layer thickness was so chosen that the laminates had high optical transparency and at the same time acceptable surface resistivity were deficient in interlayer adhesion and resistance to abrasion. Improvement of these two properties has long been sought.

SUMMARY OF THE INVENTION

According to this invention, there is provided a laminate film, having a light transparence greater than 40% and a surface resistivity of at most $10^7$ ohms per square, said laminate comprising a substrate layer of a substantially optically transparent organic, polymeric material, a coupling layer of crosslinked acrylic, polymeric material bonded to one surface of the substrate layer, and a metal layer bonded to the coupling polymer layer. A top coating of a substantially optically transparent polymer, often having a photoconductive material dispersed therein, normally is applied over the metal layer.

DETAILED DESCRIPTION OF THE INVENTION

The substrate can be any organic film material having sufficient optical transparence and adequate surface resistivity. The film material should be a dielectric. For the purpose of this invention, a substrate film is substantially optically transparent when it transmits more than 90% of incident light perpendicular to the film's surface and having a wavelength of 550mµ.

The surface resistivity of the substrate material should be greater than $10^7$ ohms per square. For electrophotographic use, the material also must be dimensionally stable and resistant to humidity, temperature, and a variety of chemical agents.

Suitable substrate materials include, for example, polyesters, such as polycarbonates, poly(ethylene terephthalate), polyethylene 2,6-naphthalenedicarboxylate, and cyclohexanedimethanol terephthalate; polystyrene, cellulose acetate, cellulose butyrate, poly(vinyl chloride), poly(vinylidene chloride), poly(methyl methacrylate), polyethylene, poly(vinyl acetate), polycaprolactam, and poly(hexamethyleneadipamide). Poly(ethylene terephthalate) is the preferred substrate material because of its good mechanical strength, flexibility, and general handling character which makes it suitable for photographic use.

The substrate film usually will have a thickness of about 75 to 175 microns. Various additives may be incorporated into the substrate material, for example, dyes, slip additives, surface treatment agents, and the like, so long as those additives do not decrease optical transparency or surface resistivity or otherwise interfere with the intended use of the film.

The coupling polymer layer, which is applied to the substrate polymer film, is an acrylic copolymer having functional groups which allow crosslinking, such as hydroxyl, carboxyl, amine, amide, or oxirane. Typically, these copolymers will be formed from acrylic esters, acids, and amides taken in suitable proportions so that the final crosslinked product will posses the necessary mechanical and optical properties. Both acrylic and methacrylic acids and their derivatives can be used as comonomers. Suitable esters include methyl, ethyl, propyl, isopropyl, butyl, hexyl, heptyl, octyl, 2-ethylhexyl, glycidyl, and hydroxyethyl acrylate and methacrylate. The crosslinking agent is normally added to the coating bath or coating composition. Suitable crosslinking agents can be readily chosen by one skilled in the art from a variety of commercially available polymer crosslinking agents capable of reacting with the functional groups of the acrylic polymer. Most frequently these will be condensation products of formaldehyde with melamine, urea, diazines, and their derivatives. The amount of the crosslinking agent must be sufficient to produce, on reaction with the functional groups of the acrylic polymer, a coating having good mechanical and optical properties. The substrate polymer film often is oriented by stretching, either monoaxially or biaxially. When oriented film is used, the coating can be applied either prior to or after stretching, as well as between two stretching operations.

Typical acrylic copolymer will be an ethyl acrylate/methyl methacrylate/methacrylamide or a methyl methacrylate/ethyl acrylate/methacrylic acid terpolymer. These and other similar acrylic copolymers are available commercially from several sources. A commonplace crosslinking agent is a melamine/formaldehyde condensate.

The amount of coupling polymer applied to the substrate polymer is normally about 0.01 to 0.25g/m². A dry polymer coating is about 0.01 to 0.25 microns thick.

The metal layer is applied to the coupling polymer coating by any convenient technique, such as, for example, by vacuum deposition, sputtering, or chemical deposition. The particular technique which should be used in each case depends on the metal being applied. Suitable metals include, among others, aluminum, nickel, palladium, chromium, gold, or a nickel-chrome alloy. It is necessary to deposite a sufficient amount of metal to obtain a surface conductivity value of less than $10^7$ ohms/square. However, the amount of the metal should be sufficiently small to maintain the optical transparency of the metallized sheet at at least 40%. The preferred metal is palladium because it can be deposited by continuous vaporization in very thin layers, which are at least 75% transparent, while providing sufficient conductivity. Typically, the conducting metal layer is about 10–150 Å thick.

The process of the present invention provides excellent adhesion, uniformity, and abrasion resistance. It is not necessary to preclean the substrate film, for example, by electron discharge, flame treatment, glow discharge, or argon plasma backsputtering.

When a photoconductive material-containing top coating is applied over the metal layer, the laminate is suitable for use as an electrophotographic transparency. The top coating also provides mechanical protection to the metal layer. Many photoconductive materials are known to the art. Certain organic, photoconductive polymers have been previously reported. They include, for example, polyvinylcarbazole, polyvinylpyrene, polyvinylacridine, polyvinyldibromocarbazole, and polypyrenyl methylvinyl ether. However, a photoconductive material is not always present in the top layer. Transparencies which can be used for other electrical, not photoelectric, imaging processes will have a polymeric top coating containing no photosensitive additives. The top coating may also contain various stabilizers, slip agents, plasticizers, and other additives, so long as they do not interfere with the intended application of the finished article. This layer will usually be about 5 to 25 microns thick and is applied by any convenient method, including doctor knife, spray, and roll. While any polymeric material base, containing — if desired — a suitable photopolymer and having sufficient adhesion, optical clarity, and mechanical properties can be used, the preferred top coating material is a vinyl acetate/vinyl chloride copolymer, which is available commercially from Union Carbide Corporation under the name VAGH ®. This polymer can be applied from solution in organic solvents. Residual solvent is heat-evaporated.

This invention is now illustrated by the following examples, wherein all parts, proportions, and percentages are by weight, unless otherwise indicated.

Laminate Preparation

Poly(ethylene terephthalate), Mylar ® D, films having a thickness of 125 microns were prepared as follows:
A. No pretreatment
B. Surface-treated by electrical discharge at 0.03 to 0.21 coulomb/sq.ft. min.
C. Coated with an acrylic polymer hydrosol.

The polymer was a biaxially oriented copolymer of methyl methacrylate/ethyl acrylate/methacrylic acid, 50/45/5, made according to U.S. Pat. No. 3,808,027 to Anderson et al., in the form of a dispersion containing 0.5% phosphate ester surfactant. The dispersion was diluted to 5% solids and neutralized with 1.3 times the theoretical amount of ammonia, thus being converted to a polymer hydrosol. The coating bath contained 0.45 g of hexamethylated melamine/formaldehyde resin (Cymel ® 303, Am. Cyanamid) per 180 g of diluted polymer hydrosol, 0.3 g of a vinylpyrrolidone copolymer thickener (Collacral ® VL, BASF), and 0.045 g of fumed silica (Aerosil ® OX 50, Degussa).

Just prior to metallization, these films were further handled as follows:
D. No precleaning
E. Surface-treated by glow discharge in a Varian NRC 3117 metallizer for 4 minutes at 4 KV, 250 mA, and 0.1 torr.
F. Surface-treated by argon plasma backsputtering in a Varian NRC 801 metallizer with RF source at 5 KV and $10^{-4}$ torr.

The Mylar ® films were then coated with metallic palladium by flash evaporation in a Varian NRC 3117 metallizer, using a resistance-heated W boat with a 10–15 mg palladium charge. Films were maintained at $10^{-6}$ torr for 6 min. prior to metallization. Total transparence of the metallized film was in the 45–70% range as determined with a Hunterlab D25 Color and Color Difference Meter. The surface resistivities of the metallized films were measured with parallel brass electrodes 7 mm in width and 52 mm in length, located 52 mm apart. These resistivities were in the range of 300–10,000 ohm/sq.

A portion of the metallized Mylar ® films was further coated with a commercial vinyl acetate/vinyl chloride copolymer, VAGH ® (from Union Carbide Corporation), using a Bird 0.005 coating bar. The coating solution was a mixture of equal volumes of methyl ethyl ketone and toluene, containing 10% solids. The thickness of the top coating was 5–10$\mu$. The coated laminate was then dried 3 min. at 120° C.

Adhesion Testing

The adhesion strength of the sucessive layers in the laminates of the present invention was determined both for the metallized substrate without the top coating and for the finished, coated, laminate. These tests determine the removal of material with a commercial adhesive tape.

1. Metal-to-Substrate Adhesion Test

A grid pattern of 50 squares having 4 mm sides was cross-hatched on the metal-coated film. Scotch ® 610 tape, 1-inch wide, was laid over the grid and removed with a sharp pull. The number of squares removed in two trials was recorded. All samples passed this test.

2. Top Coat-to-Metal-to-Substrate Adhesion Test

The Scotch ® tape test was carried out on the top-coated metallized films as in test 1, above. The results are given in the following table.

Abrasion Testing

Abrasion damage was determined by placing a top-coated, metallized substrate film on a paper towel, coated side up. Surface resistivity was determined in two perpendicular directions. A fresh sheet of 125-$\mu$ thick Mylar ® D polyester film was placed on top of the coating, and a 400 g weight was placed on the Mylar ® film. It exerted a pressure of 42 g/cm$^2$. The weight then was dragged across the surface in one of the directions for which surface resistivity had been determined, and the resistivity was remeasured in both directions. This cycle was repeated three times. The degree of abrasion damage was determined as the ratio of final resistivity to initial resistivity. The results are given in the table below. Initial resistivities of all samples were about 300–1000 ohms/sq.

A commercial sample of a palladium-metallized, top-coated, 125-$\mu$ thick transparency believed to have been made according to British Pat. No. 1,417,628 also was evaluated in these tests for comparison. The results are presented below.

TABLE[1]

| Example | Pretreatment | Precleaning | Adhesion Metal-to-Substrate[2] | Topcoat-to-Metal-to-Substrate[3] | Abrasion Damage |
|---|---|---|---|---|---|
| 1 | none | none | excellent | 2 | 2 |
| 2 | none | glow discharge | fair | 0 | 3 |
| Comparative 1 | none | none | poor | 100 | 19 |
| Comparative 2 | electrical discharge | none | poor | 100 | 60 |
| Comparative 3 | none | Ar plasma back-sputtered (Ni) | excellent | 97 | 380 |
| Comparative 4 | electrical discharge | glow discharge | good | 100 | 20 |
| Compartive 5 (Brit. 1,417,628) | | | excellent | 100 | 19 |

[1]Examples 1 and 2 give data for the top-coated laminates of the present invention. Comparative Examples 1-4 give data for top-coated laminates in which the acrylic coupling polymer layer was omitted.
[2]Since all metallized films passed the Scotch ® tape tests, additional, qualitative tests were made (rubbing with tissue and thumb).
[3]Squares removed, out of 100.

The above results show that the top-coated laminates of the present invention had very high adhesion and abrasion resistance, while all the top-coated comparison samples failed or virtually failed the Scotch ® tape adhesion test and sustain abrasion damages that can be described as moderate to very high.

We claim:

1. A laminate film having an optical transparence greater than 40% and a surface resistivity of at most $10^7$ ohms per square, said laminate comprising a substrate layer of a substantially transparent organic, polymeric material, a coupling layer of crosslinked acrylic, polymeric material bonded to one surface of said substrate layer, and a vaporized metal layer bonded to the coupling polymer layer; the optical transparence of said laminate and of any of its component layers being measured with respect to incident light having a wavelength of 550mμ, perpendicular to the surface of said laminate or component layer.

2. The laminate of claim 1 wherein the substrate film is poly(ethylene terephthalate).

3. The laminate of claim 1 wherein the metal layer is palladium, aluminum, gold, nickel, chromium, or a nickel-chrome alloy.

4. The laminate of claim 1 wherein the coupling polymeric layer is a methyl methacrylate/ethyl acrylate/methacrylic acid copolymer crosslinked with an amine-formaldehyde resin.

5. A transparency consisting of a laminate of claim 1 having a top coating of a polymeric material over the conductive metal layer.

6. A transparency of claim 5 wherein the top coating consists essentially of a base polymer having a photoconductive material dispersed therein.

7. A transparency of claim 5 wherein the base polymer is a vinyl acetate/vinyl chloride copolymer.

8. A method of making an electrophotographic transparency, said method comprising: (1) applying to a substantially optically transparent substrate polymer film a crosslinkable acrylic polymer dispersion containing a crosslinking agent for said polymer; (2) heating the coated film to cure the acrylic polymer; (3) applying to the surface of the crosslinked acrylic polymer layer by continuous vaporization a metal coating in such an amount that the optical transparence of the resulting laminate is greater than 40%, while its electrical surface resistivity is less than $10^7$ ohms per square; and (4) applying over the metal layer a top coating of a base polymer having a photoconductive material dispersed therein.

9. A method of claim 8 wherein the substrate polymer film is poly(ethylene glycol terephthalate).

10. A method of claim 8 wherein the crosslinkable acrylic polymer layer is a methyl methacrylate/ethyl acrylate/methacrylic acid copolymer and the crosslinking agent is an amine/formaldehyde resin.

11. A method of claim 8 wherein the metal coating is nickel, chromium, aluminum, gold, palladium, or a nickel-chrome alloy.

12. A method of claim 8 wherein the base polymer of the top coating is a vinyl acetate/vinyl chloride copolymer.

* * * * *

UNITED STATES PATENT OFFICE
CERTIFICATE OF CORRECTION

PATENT NO. : 4,109,052
DATED : August 22, 1978
INVENTOR(S) : Jerrel Charles Anderson and Edward George Stroh, Jr.

It is certified that error appears in the above-identified patent and that said Letters Patent are hereby corrected as shown below:

Cover page, item [75], Inventor, should read:
  Jerrel Charles Anderson, Vienna, W.Va. and Edward George Stroh, Jr., Circleville, Ohio.

Column 3, line 13, "A" should read "$\overset{\circ}{A}$".

Signed and Sealed this

Eighth Day of May 1979

[SEAL]

Attest:

RUTH C. MASON
Attesting Officer

DONALD W. BANNER
Commissioner of Patents and Trademarks